United States Patent [19]
Chan et al.

[11] Patent Number: 5,087,608
[45] Date of Patent: Feb. 11, 1992

[54] ENVIRONMENTAL PROTECTION AND PATTERNING OF SUPERCONDUCTING PEROVSKITES

[75] Inventors: Siu W. Chan, Metuchen; Leonilda A. Farrow, Middletown, both of N.J.

[73] Assignee: Bell Communications Research, Inc., Livingston, N.J.

[21] Appl. No.: 458,185

[22] Filed: Dec. 28, 1989

[51] Int. Cl.$^5$ .............................................. H01L 39/00
[52] U.S. Cl. ....................................... 505/1; 505/728; 505/730; 505/731; 505/732; 156/652; 156/656; 156/659.1; 427/39; 427/62; 427/70; 427/122; 427/249; 423/446; 423/448
[58] Field of Search ................ 427/39, 62, 70, 122, 427/113, 249; 437/228; 156/652, 656, 655, 659.1, 667, 643; 505/728, 730, 731, 732; 423/446, 448

[56] References Cited

U.S. PATENT DOCUMENTS 4,761,308  8/1988  Gebhardt et al. .............. 427/122 X

FOREIGN PATENT DOCUMENTS 6489483  4/1989  Japan .................................. 505/728
1148702  6/1989  Japan .................................. 505/731

OTHER PUBLICATIONS

Morohashi et al., "Plasma Polymerization for High $T_c$ Oxide Superconductors", Appl. Phys. Lett. 52(22), May 30, 1988, pp. 1897-1898.
Spear, "Diamond-Ceramic Coating of the Future", J. Am. Ceram. Soc., 72 [2] 171-191 (1989).

*Primary Examiner*—David A. Simmons
*Assistant Examiner*—Thi Dang
*Attorney, Agent, or Firm*—Leonard Charles Suchyta; Lionel N. White

[57] ABSTRACT

A method for the passivation of superconductive rare earth cuprates involves depositing thereon a thin film of an amorphous or diamond-like carbon film of a thickness ranging from 100 Å to 10 microns. The cuprate film may be in the as-deposited form, so necessitating a subsequent annealing step to convert the film to a superconducting phase and to remove the carbon.

10 Claims, No Drawings

ENVIRONMENTAL PROTECTION AND PATTERNING OF SUPERCONDUCTING PEROVSKITES

FIELD OF THE INVENTION

This invention relates to a method for the passivation and protection of superconducting materials. More particularly, the present invention relates to the passivation and environmental protection of superconducting rare earth cuprate thin films.

BACKGROUND OF THE INVENTION

Electronic device applications utilizing high temperature superconductors require stable, patterned thin films. The reliability of these devices is also dependent upon the inertness of these films in diverse operating ambients. Unfortunately, studies have revealed that the superconducting films of interest, namely, the rare earth barium cuprates, decompose in water or humid environments and react rapidly with weak acids or bases. Although the instability of these films occurs in both the fired and unfired states, films in the unfired state are particularly susceptible to degradation. Accordingly, device fabrication utilizing such thin film superconductors is oftimes hindered.

DETAILED DESCRIPTION

In accordance with the present invention, a technique is described for obviating these prior art limitations. Briefly, the described technique involves depositing a thin layer of carbon upon the superconducting films, such layer serving as a protective measure against deterioration caused by the atmosphere. Carbon deposition is effected either by electron beam deposition or by plasma dissociation of hydrocarbons, resulting in an amorphous or diamond-like carbon film, respectively. The resultant coatings may, subsequently, be removed by annealing in an oxygen atmosphere or by plasma oxidation at low temperatures with essentially no residue.

In the practice of the present invention, the first step involves obtaining a rare earth barium cuprate. Typically, this end is attained by co-evaporation of the components thereof by conventional electron beam deposition techniques at reduced pressures. Alternatively this may also be effected by sputtering or laser deposition at $10^{-2}$ to $10^{-6}$ Torr. Following, carbon deposition may be effected in situ utilizing the same electron beam apparatus using graphite or any other high carbon content source. Thickness is controlled by a quartz crystal or other suitable monitoring source to a value within the range of 100 Å-10 microns, such range being determined by considerations relating to pinhole content at the lower range and stress in the film at the upper range beyond which peeling occurs.

If the underlying film is already superconducting, no further treatment is required and the structure is then suitable for device fabrication utilizing photolithographic techniques or storage. In the event the underlying film is not superconducting, annealing must be effected at 600°-850° C. to remove the carbon film and convert the underlying film to a superconducting phase.

An example of the application of the present invention is set forth below. This example is solely for purposes of exposition and is not to be construed as limiting.

EXAMPLE

Barium metal, yttria ($Y_2O_3$) and copper were evaporated in a vacuum evaporator at $10^{-5}$ Torr oxygen by electron beam and thermal resistive heating for a time period sufficient to yield a thin film deposit of 1 micron upon a strontium titanate degreased substrate. Before breaking the vacuum, a crucible containing graphite was rotated into the electron beam trajectory path and deposition of carbon (amorphous) effected at room temperature, the thickness of the carbon film being controlled to yield a film of approximately 200 Å.

The substrate bearing the thin film was then removed from the apparatus and thermally annealed at 850° C. for 30 minutes in an oxygen atmosphere (1 atmosphere) to remove the carbon film to convert the film to superconducting $YBa_2Cu_3O_{7-x}$.

It will be understood that diamond-like carbon coatings can be deposited upon the thin film materials by plasma dissociation of hydrocarbons, such as butane, methane and the like using any plasma (RF). Studies have revealed that the $YBa_2Cu_3O_{7-x}$ films bearing a carbon coating are less degradable in the ambient than those without any coating.

Encapsulation of the $YBa_2Cu_3O_{7-x}$ films with a 20 nm thick film of diamond-like carbon was effected by dissociation of butane in a radio frequency (13.56 MHz) plasma with a 20 millitorr gas pressure at room temperature. These coatings were transparent to light and Raman spectra demonstrated that the $YBa_2Cu_3O_{7-x}$ films retained their good quality after the coating procedure. Furthermore, no deterioration was detected in the Raman spectra over the course of a day in contrast with uncoated samples.

Water permeability of both the amorphous and diamond-like carbon films was measured as follows. An amorphous carbon film of 45 nm was electron deposited on a thin sheet of cellulose acetate at $4 \times 10^{-6}$ Torr. A diamond-like film of the same thickness was deposited on another sheet of cellulose acetate for comparison. A blank cellulose sheet was used as a control. The coated and blank sheet were stretched over and clamped on the rims of 2 inch diameter stainless steel cups with viton seals. The cups were half filled with water. The weight of each of the three assemblies was measured before and after a week of storage over $P_2O_5$ inside a desiccator. From the loss in weight, relative water vapor permeability through the three sheets at room temperature was estimated. The diamond-like coated cellulose acetate sheet was found to be two times less permeable than the amorphous coated cellulose acetate sheet which, in turn, was four times less permeable than the uncoated sheet.

The protective carbon films have also been found suitable for preparing patterned superconducting films. Specifically, the carbon film may be deposited upon an as-deposited film of superconducting material. Following, a patterned organic film is placed upon the carbon film using conventional photolithographic techniques. Then a low temperature oxygen plasma may be used to etch away the carbon film from these areas not covered by the organic film, which, while it is also etched by the plasma, is not removed because it is thicker than the carbon film. Nitric acid may then be used to chemically etch away the exposed superconducting films, so leaving a patterned as-deposited superconducting film covered by the carbon and organic films. This structure may then be annealed in an oxygen rich environment to produce the superconducting phase and to remove both the carbon and organic films.

What is claimed is:

1. Method for patterning a superconducting film comprising a rare earth barium cuprate which comprises the steps of:
   (a) depositing a thin film of a rare earth barium cuprate upon a substrate,
   (b) depositing a thin film consisting of a material selected from the group consisting of amorphous and diamond-like carbon upon said cuprate in a thickness ranging from 100 Å to 10 microns,
   (c) depositing a pattern of an organic film upon the carbon by photolithographic techniques,
   (d) etching the carbon film from these areas not protected by the organic film with an oxygen plasma, and
   (e) chemically etching the exposed superconducting film to leave a patterned as-deposited superconducting film covered by the carbon and organic films.

2. Method in accordance with claim 1 wherein the resultant structure is annealed in an oxygen ambient to produce the superconducting phase and to remove the carbon and organic films.

3. Method in accordance with claim 2 wherein the cuprate is $YBa_2Cu_3O_{7-x}$.

4. Method in accordance with claim 2 wherein the carbon film as deposited by electron beam evaporation of graphite at room temperature.

5. Method in accordance with claim 2 wherein the carbon film is deposited by radio frequency plasma dissociation of a hydrocarbon at room temperature.

6. Method for passivation of superconductive rare earth cuprate thin films which comprises depositing a thin film consisting of material selected from the group consisting of amorphous and diamond-like carbon upon said cuprate in a thickness ranging from 100 Å to 10 microns.

7. Method in accordance with claim 6 wherein said thin film cuprate is $YBa_2Cu_3O_{7-x}$.

8. Method in accordance with claim 6 wherein the carbon film is deposited by electron beam evaporation of graphite at room temperature.

9. Method in accordance with claim 6 wherein the carbon film is deposited by radio frequency plasma dissociation of a hydrocarbon at room temperature.

10. Method in accordance with claim 7 wherein the resultant structure is thermally annealed in an oxygen containing atmosphere to remove the carbon coating and induce superconductivity in the underlying film.

* * * * *